United States Patent
Colwell et al.

(10) Patent No.: US 9,623,591 B2
(45) Date of Patent: Apr. 18, 2017

(54) METHOD OF ENCAPSULATING AN ELECTRONIC COMPONENT

(71) Applicant: BASF SE, Ludwigshafen (DE)

(72) Inventors: Harold Colwell, Chesterfield, VA (US);
Inga Marie Balke, Wyandotte, MI (US); Lee Ann Dombrowski, Chesterfield Township, MI (US); Richard J. Lair, Long Valley, NJ (US); David M. Lange, Monroe, MI (US); Axel Wilms, Frankenthal (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/760,605

(22) PCT Filed: Jan. 13, 2014

(86) PCT No.: PCT/US2014/011297
§ 371 (c)(1),
(2) Date: Jul. 13, 2015

(87) PCT Pub. No.: WO2014/113323
PCT Pub. Date: Jul. 24, 2014

(65) Prior Publication Data
US 2015/0366076 A1    Dec. 17, 2015

Related U.S. Application Data

(60) Provisional application No. 61/752,633, filed on Jan. 15, 2013.

(51) Int. Cl.
*B29C 44/12*    (2006.01)
*B29C 44/34*    (2006.01)
(Continued)

(52) U.S. Cl.
CPC ........ *B29C 44/355* (2013.01); *B29C 44/1266* (2013.01); *B29C 44/1271* (2013.01);
(Continued)

(58) Field of Classification Search
CPC ..... B29C 70/26; B29C 70/72; B29C 44/1271; B29C 44/355; B29C 45/14639
(Continued)

(56) References Cited

U.S. PATENT DOCUMENTS 3,919,371 A * 11/1975 Jache ...................... B29C 45/14
264/262
4,082,719 A * 4/1978 Liles ........................ C08L 63/00
523/400

(Continued)

FOREIGN PATENT DOCUMENTS

DE    10 2006 012 072 A1    9/2007
EP    0 361 194 A2    4/1990
(Continued)

OTHER PUBLICATIONS

International Search Report for Application No. PCT/US2014/011297 dated May 8, 2014, 3 pages.
(Continued)

*Primary Examiner* — Atul P. Khare
(74) *Attorney, Agent, or Firm* — Howard & Howard Attorneys PLLC

(57) ABSTRACT

An encapsulated electronic assembly comprises an electronic component and a foamed thermoplastic shell disposed about the electronic component. The foamed thermoplastic shell is formed from a thermoplastic encapsulant comprising a thermoplastic resin and a filler and is foamed with a foaming agent. A method of encapsulating the electronic component to form the encapsulated electronic assembly is also provided. The method includes the steps of melting the
(Continued)

thermoplastic encapsulant, foaming the thermoplastic encapsulant, and injection molding the foamed thermoplastic encapsulant about the electronic component to form the foamed thermoplastic shell.

15 Claims, 7 Drawing Sheets

(51) Int. Cl.
| | |
|---|---|
| B29C 70/26 | (2006.01) |
| B29C 70/72 | (2006.01) |
| B29C 45/14 | (2006.01) |
| H05K 3/28 | (2006.01) |
| H05K 5/06 | (2006.01) |
| B29C 45/00 | (2006.01) |
| H05K 5/00 | (2006.01) |
| H05K 1/18 | (2006.01) |
| H05K 1/00 | (2006.01) |
| B29K 77/00 | (2006.01) |
| B29K 509/00 | (2006.01) |
| B29L 31/34 | (2006.01) |

(52) U.S. Cl.
CPC .... *B29C 45/0013* (2013.01); *B29C 45/14639* (2013.01); *B29C 70/26* (2013.01); *B29C 70/72* (2013.01); *H05K 1/185* (2013.01); *H05K 3/284* (2013.01); *H05K 5/0034* (2013.01); *H05K 5/065* (2013.01); *B29K 2077/00* (2013.01); *B29K 2509/00* (2013.01); *B29L 2031/3425* (2013.01); *H05K 2201/0116* (2013.01); *H05K 2201/10151* (2013.01); *H05K 2203/1316* (2013.01); *H05K 2203/1327* (2013.01)

(58) Field of Classification Search
USPC ........ 264/45.3, 45.5, 50, 54, 272.13, 328.18
See application file for complete search history.

(56) References Cited

U.S. PATENT DOCUMENTS

| | | | | |
|---|---|---|---|---|
| 4,370,292 A | * | 1/1983 | Yanase | H05K 5/065 |
| | | | | 257/E23.121 |
| 5,520,863 A | * | 5/1996 | Ochi | G06K 19/077 |
| | | | | 264/161 |
| 6,180,045 B1 | | 1/2001 | Brandenburg et al. | |
| 6,307,749 B1 | | 10/2001 | Daanen et al. | |
| 6,779,260 B1 | | 8/2004 | Brandenburg et al. | |
| 7,037,455 B2 | * | 5/2006 | Marine | A63H 3/36 |
| | | | | 264/130 |
| 7,141,874 B2 | | 11/2006 | Nakatani | |
| 7,268,429 B2 | | 9/2007 | Brandenburg et al. | |
| 7,473,585 B2 | | 1/2009 | Brandenburg et al. | |
| 7,510,108 B2 | | 3/2009 | Lawlyes et al. | |
| 7,533,457 B2 | | 5/2009 | Foehringer et al. | |
| 7,582,510 B2 | | 9/2009 | Todd et al. | |
| 7,739,791 B2 | | 6/2010 | Brandenburg et al. | |
| 7,950,334 B2 | * | 5/2011 | Hasegawa | B60L 13/04 |
| | | | | 104/286 |
| 7,976,750 B2 | * | 7/2011 | Burmeister | B29C 44/1266 |
| | | | | 264/173.11 |
| 7,985,362 B2 | * | 7/2011 | Lawrence | B29C 41/04 |
| | | | | 264/250 |
| 2002/0009584 A1 | * | 1/2002 | Boyer | B29C 44/1266 |
| | | | | 428/315.5 |
| 2002/0147244 A1 | * | 10/2002 | Kishbaugh | B29C 45/0001 |
| | | | | 521/50 |
| 2008/0017976 A1 | | 1/2008 | Lai et al. | |
| 2009/0085248 A1 | | 4/2009 | Brandenburg et al. | |

FOREIGN PATENT DOCUMENTS

| | | |
|---|---|---|
| WO | WO 01/97584 A2 | 12/2001 |
| WO | WO 02/26482 A1 | 4/2002 |

OTHER PUBLICATIONS

Cookson Electronics, "Cookson Semiconductor Packaging Materials Technical Bulletin—Staychip Capillary Underfill Encapsulants", CUF Application Guidelines, May 2002, 15 pages.

Dupont Engineering Polymers, "Electrical/Electronic Thermoplastic Encapsulation", Jun. 1997, 20 pages.

National Semiconductor, "Semiconductor Packaging Assembly Technology", Aug. 1999, pp. 1-8.

Xu et al., "Microcellular Foam Processing in Reciprocating-Screw Injection Molding Machines", Trexel, Inc., The Journal of Injection Molding Technology, vol. 5, 2001, 28 Pages.

English language abstract and machine-assisted English translation for DE 10 2006 012 072 extracted from espacenet.com database on Jul. 16, 2015, 14 pages.

English language abstract and machine-assisted English translation for EP 0 361 194 extracted from espacenet.com database on Jul. 16, 2015, 17 pages.

* cited by examiner

METHOD OF ENCAPSULATING AN ELECTRONIC COMPONENT

RELATED APPLICATIONS

This application is the National Stage of International Patent Application No. PCT/US2014/011297, filed on Jan. 13, 2014, which claims priority to and all the advantages of U.S. Patent Application No. 61/752,633, filed on Jan. 15, 2013, the contents of which are incorporated herein by reference.

FIELD OF THE DISCLOSURE

The present disclosure generally relates to a method of encapsulating an electronic component to form an encapsulated electronic assembly comprising a foamed thermoplastic shell disposed about the electronic component.

DESCRIPTION OF THE RELATED ART

Electronic assemblies typically comprise various combinations of a substrate, a circuit board, and various electronic components, such as flip chips, attached thereto. These electronic components typically have solder bumps/joints that are reflowed to attach the electronic components to contact pads on the circuit board.

Given the components and structure of such electronic assemblies, they are often delicate and vulnerable to damage during handling and use. Mechanical shock or impact during handling and use often causes circuit board flexure which leads to cracking at the interfaces between the substrate and the solder joints and between the solder joints and electronic components. Once these electronic assemblies are in use, solder bump fatigue often causes these electronic assemblies to fail. A coefficient of thermal expansion ("CTE") mismatch between the circuit board and the electronic components is typically responsible for the onset of solder fatigue and ultimately failure of these electronic assemblies during thermal cycling.

As such, under filling encapsulants were developed to improve reliability of early electronic assemblies such as flip chip assemblies. The under filling process, i.e., inserting a curable liquid epoxy resin between the die and substrate, dramatically improves the reliability of the electronic assembly by distributing stress from the CTE mismatch over an entire area of the circuit board, instead of just over the solder bumps/joints. That is, once cured, the thermosetting under fill encapsulant distributes the stresses caused by the CTE mismatch over the entire electronic component and improves the thermal cycling performance of the electronic assembly. In addition to improving the thermal cycling performance, under fill encapsulants increase the mechanical strength of the electronic assembly.

Despite the many problems solved by the use of under fill encapsulants in electronic assemblies, there are many other problems associated with the use of these thermosetting materials. Once the under fill encapsulant has been properly applied, the electronic assembly must still undergo a bake process to cure the under fill encapsulant. After the under fill encapsulant cures, the electronic assembly can be handled with less concern and the electronic component itself and solder bumps thereof are also less vulnerable to damage. However, the electronic assembly must still be packaged in a thermoplastic shell, typically "clam shell" type packaging, to provide durability and additional protection against environmental conditions such as high temperatures. Clam shell packaging typically includes a shell comprising two half shells, hence the reference to a "clam shell", and a sealing material which is pinched between the two half shells to exclude moisture when the electronic assembly is encased. Of course, the process of forming clam shell packaging and encasing the electronic assembly with the clam shell packaging is labor intensive and requires testing to make sure that the electronic assembly is hermetically sealed.

Accordingly, there remains an opportunity to develop an improved encapsulant which is not a thermoset but can be applied to the electronic assembly to provide durability and increase the lifespan of the electronic assembly and which eliminates many of the inefficiencies associated with the under filling process and the use of clam shell packaging. To this end, there also remains an opportunity to provide an efficient process for forming an electronic assembly with the improved encapsulant which is inexpensive and reliable.

SUMMARY OF THE DISCLOSURE AND ADVANTAGES

An encapsulated electronic assembly is provided. The encapsulated electronic assembly includes an electronic component and a foamed thermoplastic shell disposed about the electronic component. The foamed thermoplastic shell is formed from a thermoplastic encapsulant comprising a thermoplastic resin and a filler, and is foamed with a foaming agent.

A method of encapsulating the electronic component to form the encapsulated electronic assembly is also provided. The method includes the steps of melting the thermoplastic encapsulant, foaming the thermoplastic encapsulant, and injection molding the foamed thermoplastic encapsulant about the electronic component to form the foamed thermoplastic shell.

The method of encapsulating the electronic component to form the encapsulated electronic assembly uses the foamed thermoplastic material to both encapsulate and protect the electronic component. As such, the method of encapsulating the electronic component can be conducted in an efficient, high yield, automated process which requires a minimal amount of steps and materials.

Further, because the thermoplastic encapsulant is foamed, it can be highly filled yet be injected molded at low injection pressures to effectively encapsulate the electronic component without damaging various parts, such as solder joints, of the electronic component. That is, the method allows the use of the thermoplastic encapsulant comprising polymer and filler in amounts that would typically render a thermoplastic encapsulant unmoldable or, if moldable, render a thermoplastic encapsulant which would damage the electronic component during injection molding. Further, the use of the thermoplastic encapsulant to encapsulate the electronic component typically results in the compression of the electronic component such that the various parts of the electronic component are mechanically locked with one another within the foamed thermoplastic shell. Once formed, the foamed thermoplastic shell, which is disposed about the electronic component, provides resistance to vibration and shock. As such, the encapsulated electronic assembly is typically durable and reliable.

BRIEF DESCRIPTION OF THE SEVERAL VIEWS OF THE DRAWINGS

Other advantages of the present disclosure will be readily appreciated, as the same becomes better understood by reference to the following detailed description when considered in connection with the accompanying drawings wherein.

DETAILED DESCRIPTION OF THE DISCLOSURE

Figure 1:
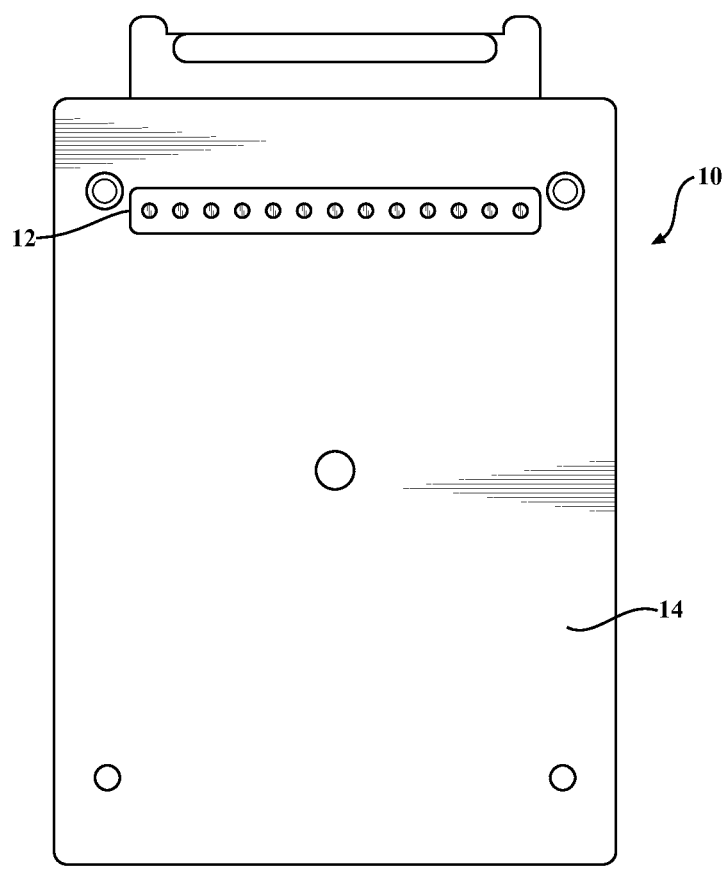
FIG. 1 is a top view of one embodiment of an encapsulated electronic assembly showing an electronic component and a foamed thermoplastic shell disposed about the electronic component.

Referring to the Figures, wherein like numerals indicate corresponding parts throughout the several views, an encapsulated electronic assembly is generally shown at 10. The instant disclosure includes the encapsulated electronic assembly 10 and a method of forming the encapsulated electronic assembly 10. The encapsulated electronic assembly 10 includes an electronic component 12 and a foamed thermoplastic shell 14 disposed about the electronic component 12. FIG. 1 is a top view of one embodiment of the encapsulated electronic assembly 10 showing an electronic component 12 and a foamed thermoplastic shell 14 disposed about the electronic component 12.

Figure 2:
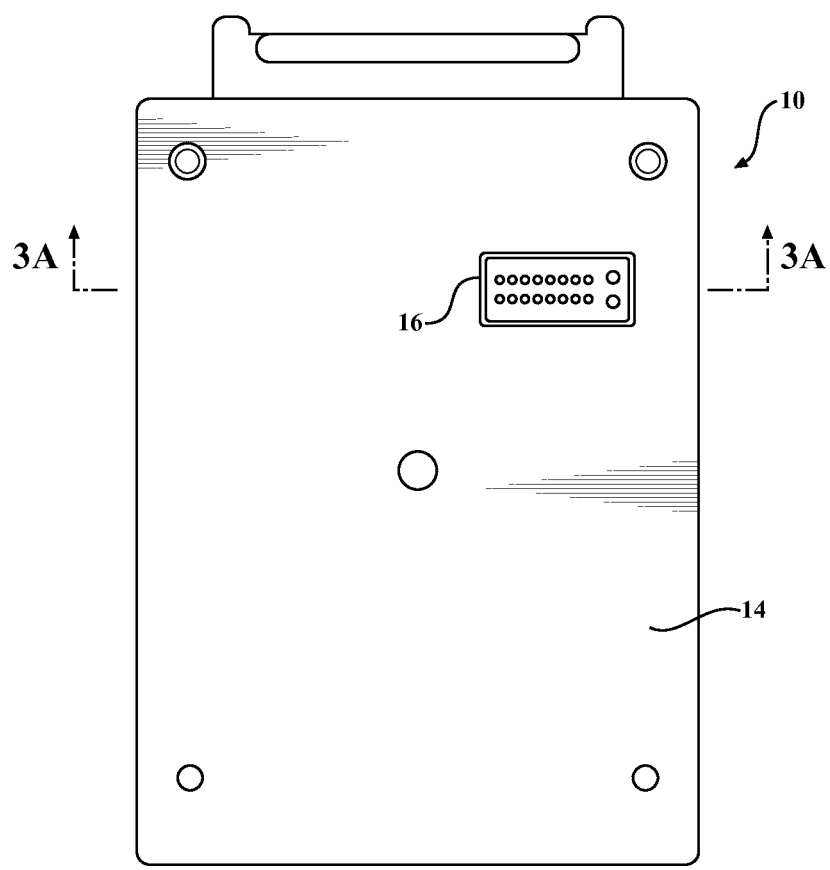
FIG. 2 is a top view of another embodiment of the encapsulated electronic assembly showing an electrical connector connected to the electronic component and extending through the foamed thermoplastic shell to provide electrical interconnection between the electronic component and an external device.
Figure 3A:
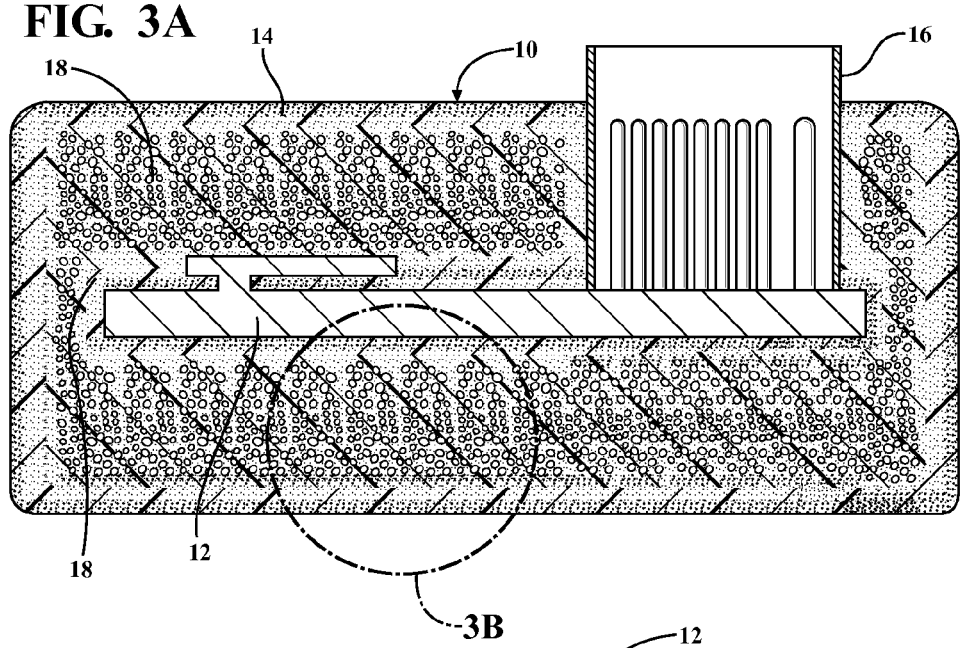
FIG. 3A is a cross-sectional view of the embodiment of the encapsulated electronic assembly shown in FIG. 2 and taken along line 3A-3A of FIG. 2.
Figure 3B:
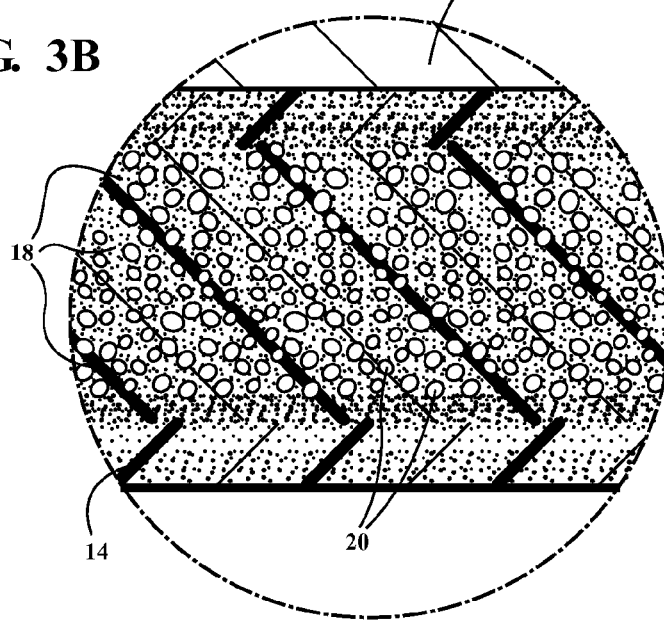
FIG. 3B is an enlarged cross-sectional view of a portion of the foamed thermoplastic shell of the encapsulated electronic assembly within circle 3B in FIG. 3A.
Figure 4A:
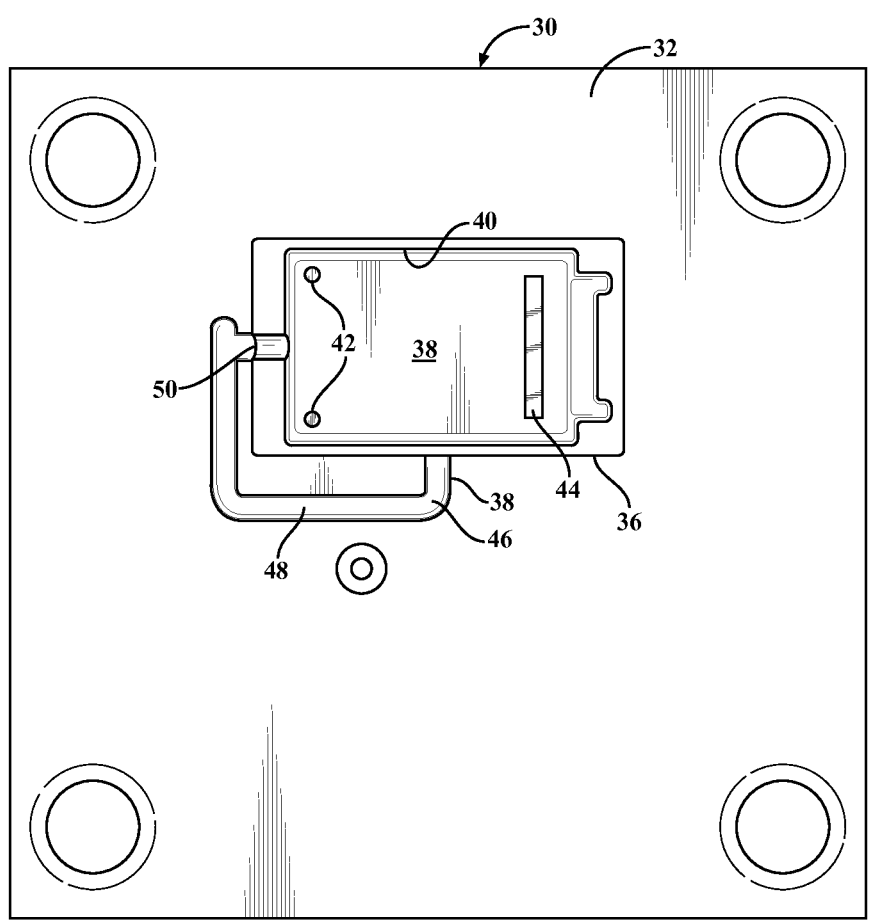
FIG. 4A is a top view of a front half of a mold for forming the encapsulated electronic assembly.
Figure 4B:
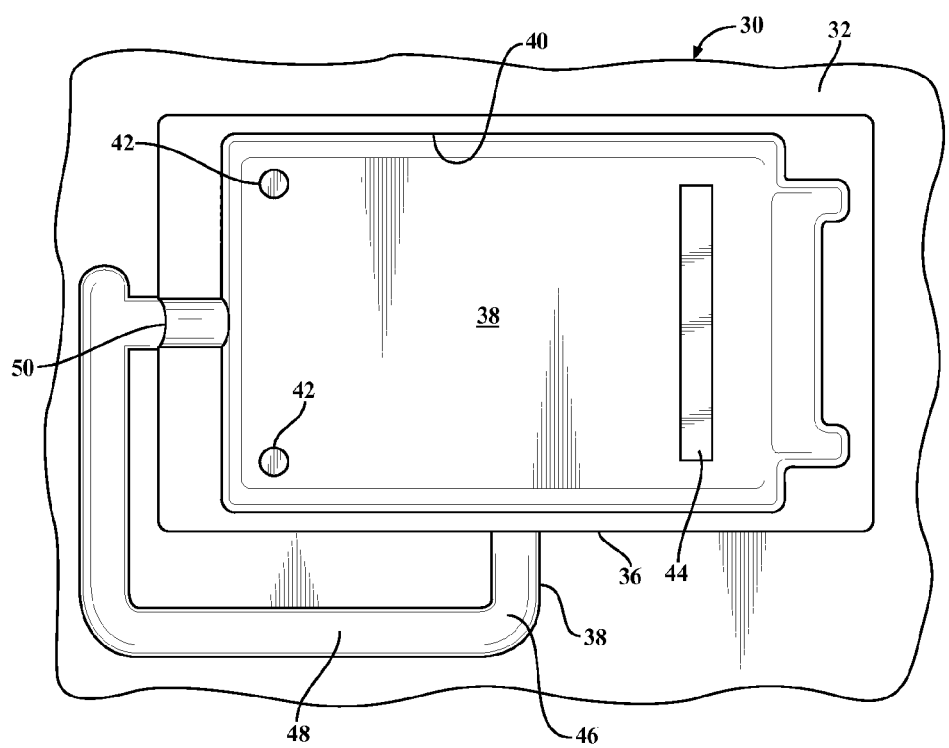
FIG. 4B is an enlarged view of the front half of the mold of FIG. 4A.
Figure 5A:
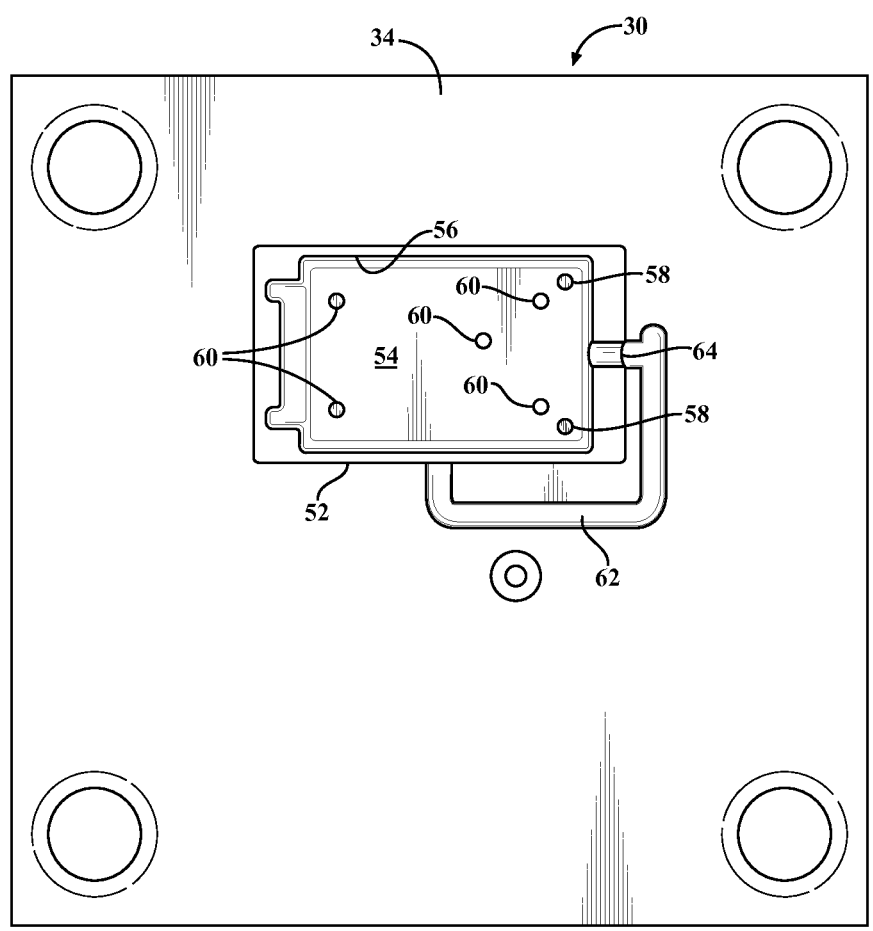
FIG. 5A is a top view of a rear half of the mold for forming the encapsulated electronic assembly.
Figure 5B:
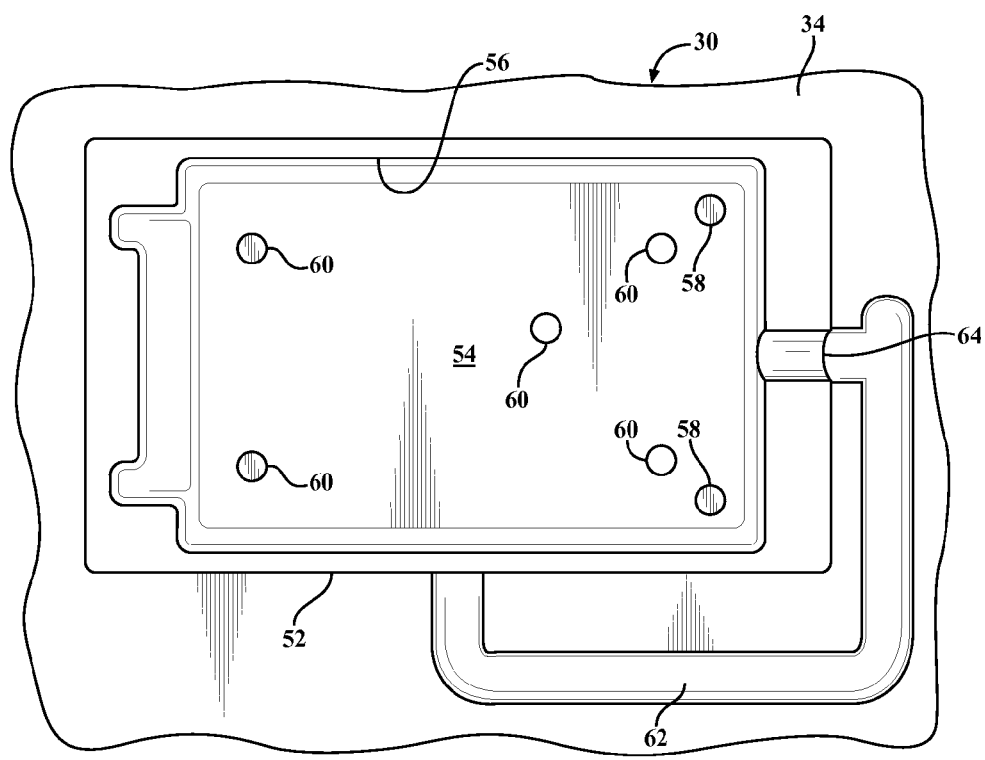
FIG. 5B is an enlarged view of the rear half of FIG. 5A.

In the embodiment of FIG. 2, the encapsulated electronic assembly 10 also includes an electrical connector 16 connected to the electronic component 12 and extending through the foamed thermoplastic shell 14 to provide electrical interconnection between the electronic component 12 and an external device (not shown). FIG. 3A is a cross-sectional view of the embodiment of the encapsulated electronic assembly 10 shown in FIG. 2 and taken along line 3A-3A of FIG. 2. FIG. 3B is an enlarged cross-sectional view of a portion of the foamed thermoplastic shell 14 of the encapsulated electronic assembly 10 within circle 3B in FIG. 3A. The foamed thermoplastic shell 14 includes a thermoplastic encapsulant 18 having cells (voids) 20 therein. The cells 20 are generally uniform in size and shape and dispersed evenly throughout the thermoplastic encapsulant 18. However, the exterior of the foamed thermoplastic shell 14 typically includes fewer, if any, cells 20, than the interior of the thermoplastic shell 14 and, if included, these cells 20 are typically smaller than the cells 20 of the interior of the thermoplastic shell 14.

The encapsulated electronic assembly 10 of the subject disclosure may be used in various automotive applications. Some non-limiting examples of the encapsulated electronic assembly 10 for use in automotive applications include an air bag module, a key fob, a seat module, an antenna module, an antenna, an electric power steering control, a suspension control, a Yaw rate sensor, a low tire pressure sensor, a crash sensor, a blind spot detection sensor, a wheel speed sensor, a door module, an ignition module, a transmission control module, a temperature sensor, a crank position sensor, a mass air flow sensor, an oxygen sensor, a cam sensor, and a power inverter subcomponent such as a capacitor pack or an insulated-gate bipolar transistor.

However, it is to be appreciated that the encapsulated electronic assembly 10 of the subject disclosure is not limited to use in automotive applications. For example, the encapsulated electronic assembly 10 may be used in appliances, computers, and consumer electronics (e.g. televisions and video recorders). The encapsulated electronic assembly 10 may even be a memory stick or jump drive.

The electronic component 12 typically includes a circuit board and various combinations of substrates, resistors, ball grid arrays, connectors, heat sink components, flip chips, etc. If included, the circuit board may be a thin laminate, a printed wiring board or any other circuit carrying substrate known in the known in the art. Further, if included, the circuit board typically has solder bumps/joints on the bottom that are reflowed to attach various sub-components to contact pads on the circuit board. In one embodiment, the electronic component 12 includes a printed circuit board.

The electronic component 12 is encapsulated with a foamed thermoplastic shell 14 comprising the thermoplastic encapsulant 18. The thermoplastic shell 14 protects the electronic component 12 from environmental conditions (e.g. temperature, humidity), provides resistance to vibration and shock, and improves the reliability of the electronic component 12 due to more closely matched coefficients of thermal expansion between the thermoplastic encapsulant 18 and the circuit board materials. Further, the thermoplastic shell 14 typically eliminates the need for clam shell assemblies comprising fasteners and seals.

The foamed thermoplastic shell 14 is formed from the thermoplastic encapsulant 18. The thermoplastic encapsulant 18 typically includes one or more thermoplastic resins. The thermoplastic resin is typically selected from the group of polyethylene, polypropylene, polyvinyl chloride, polystyrene, polytetrafluoroethylene, acrylonitrile butadiene styrene, polyamide, polyphenylene sulfide, liquid crystal polymers (e.g. aromatic polyester polymers), and combinations thereof. The thermoplastic resin is typically present in the thermoplastic encapsulant 18 in an amount of from 5 to 100, alternatively from 5 to 50, alternatively from 10 to 40, alternatively from 10 to 30, alternatively from 15 to 25, parts by weight based on 100 parts by weight of the thermoplastic encapsulant 18.

The thermoplastic resin typically includes a polyamide. The polyamide is typically selected from the group of polyamide 6 (polycaprolactam), polyamide 66 (polyhexamethyleneadipamide), polyamide 610 (polyhexamethylenesebacamide), copolyamide 6/66, and combinations thereof. In one embodiment, the thermoplastic resin includes polyamide 6. In one particular embodiment, the thermoplastic resin is polyamide 6. In another embodiment, the thermoplastic resin includes polyamide 66. In another particular embodiment, the thermoplastic resin is polyamide 66. In yet another embodiment, the thermoplastic resin includes polyamide 6/66. In yet another particular embodiment, the thermoplastic resin is copolyamide 6/66.

The thermoplastic resin is not limited to the polyamides described above. For example, the thermoplastic resin may include polyamides which are obtainable via condensation of 1,4-diaminobutane with adipic acid at elevated temperature (polyamide 4,6). As another example, the thermoplastic resin may include polyamides which are obtainable via copolymerization of two or more of the abovementioned monomers, or a mixture of two or more polyamides, in any desired mixing ratio.

Specific suitable polyamides include, but are not limited to, polyamide 26 (ethylenediamine, adipic acid), polyamide 210 (ethylenediamine, sebacic acid), polyamide 46 (tetramethylenediamine, adipic acid), polyamide 66 (hexamethylenediamine, adipic acid), polyamide 69 (hexamethylenediamine, azelaic acid), polyamide 610 (hexamethylenediamine, sebacic acid), polyamide 612 (hexamethylenediamine, decanedicarboxylic acid), polyamide 613 (hexamethylenediamine, undecanedicarboxylic acid), polyamide 1212 (1,12-dodecanediamine, decanedicarboxylic acid), polyamide 1313 (1,13-diaminotridecane, undecanedicarboxylic acid), polyamide MXD6 (m-xylylenediamine, adipic acid), polyamide TMDT (trimethylhexamethylenediamine, terephthalic acid), polyamide 4 (pyrrolidone), polyamide 6 (epsilon-caprolactam), polyamide 7 (ethanolactam), polyamide 8 (capryllactam), polyamide 9 (9-aminononanoic acid), polyamide 11 (11-aminoundecanoic acid), polyamide 12 (laurolactam), and polyphenylenediamineterephthalamide (p-phenylenediamine, terephthalic acid).

Suitable polyamides are commercially available from BASF Corporation under the ULTRAMID® brand of polyamides. In one embodiment, polyamide is typically present in the thermoplastic encapsulant 18 in an amount of from 5 to 100, alternatively from 5 to 50, alternatively from 10 to 40, alternatively from 10 to 30, alternatively from 15 to 25, parts by weight based on 100 parts by weight of the thermoplastic encapsulant 18.

The thermoplastic encapsulant 18 typically includes one or more fillers. Specific fillers suitable for use in the thermoplastic encapsulant 18 include, but are not limited to, particulate fillers such as: silicates such as wollastonite, zeolite, sericite, kaolin, mica, clay, silica (fumed, precipitated, etc.), pyrophillite, bentonite, asbestos, talc, alumina silicate and the like; metal compounds such as alumina, silicon oxide, magnesium oxide, zirconium oxide, titanium oxide, iron oxide and the like; carbonates such as calcium carbonate, magnesium carbonate, dolomite and the like; sulfates such as calcium sulfate, barium sulfate and the like; hydroxides such as magnesium hydroxide, calcium hydroxide, aluminum hydroxide and the like; and other non-fibrous fillers such as glass beads, ceramic beads, boron nitride, silicon carbide and silica. The filler may be hollow, fibrous, or plate-like. It is also possible to use two or more types of fillers as indicated above.

The thermoplastic encapsulant 18 may also include one or more fibrous fillers. Some non-limiting examples of fibrous fillers include potassium titanate fibers, zinc oxide fibers, aluminum borate fibers, alumina fibers, silicon carbide fibers, ceramic fibers, glass fibers, asbestos fibers, plaster fibers, metal fibers, polymer fibers, fibrous calcium carbonate, and fibrous wollastonite. Of course one or more of these fibrous fillers may be included in the thermoplastic encapsulant 18.

Although the filler may be of any size or shape, the filler typically has a particle size distribution of from 1 to 1,000, alternatively from 5 to 500, alternatively from 5 to 100, μm. Particles having such particle sizes allow for more filler to be used and for efficient foaming of the thermoplastic encapsulant 18.

If present, the filler is typically included in the thermoplastic encapsulant 18 in an amount of from 15 to 95, alternatively from 25 to 90, alternatively from 35 to 90, alternatively from 45 to 90, alternatively from 55 to 90, alternatively from 60 to 90, alternatively from 25 to 75, alternatively from 35 to 75, alternatively from 45 to 75, alternatively from 55 to 75, alternatively from 65 to 75, alternatively from 60 to 85, alternatively from 5 to 70, alternatively from 50 to 70, alternatively from 60 to 70, alternatively from 65 to 85, alternatively equal to or greater than 50, alternatively equal to or greater than 60, alternatively equal to or greater than 70, parts by weight based on 100 parts by weight of the thermoplastic encapsulant 18.

In one embodiment, the filler includes talc. In another embodiment, the filler is talc. The thermoplastic encapsulant 18 can include loadings of greater than 50 percent by weight filler based on 100 parts by weight thermoplastic encapsulant 18. Talc typically disperses well in, and improves the physical properties of, the thermoplastic encapsulant 18. When filled with talc, the thermoplastic encapsulant 18 typically possesses excellent processability and can be efficiently foamed to form the foamed thermoplastic shell 14. In one embodiment, talc is included in the thermoplastic encapsulant 18 in an amount of from 15 to 95, alternatively from 25 to 90, alternatively from 35 to 90, alternatively from 45 to 90, alternatively from 55 to 90, alternatively from 60 to 90, alternatively from 25 to 75, alternatively from 35 to 75, alternatively from 45 to 75, alternatively from 55 to 75, alternatively from 65 to 75, alternatively from 60 to 85, alternatively from 50 to 70, alternatively from 60 to 70, alternatively from 65 to 85, alternatively equal to or greater than 50, alternatively equal to or greater than 60, alternatively equal to or greater than 70, parts by weight based on 100 parts by weight of the thermoplastic encapsulant 18.

The thermoplastic encapsulant 18 may include one or more chemical foaming agents. The terminology chemical foaming agent refers to foaming agents which chemically react, e.g. decompose, to release a gas which foams the thermoplastic encapsulant 18. One specific, non-limiting example of a chemical foaming agent is hydrazo dicarbonamide.

In one embodiment, the thermoplastic encapsulant 18 includes a chemical foaming agent selected from the group of azo compounds, nitroso compounds, hydrazines, hydrazine derivatives, hydrogen carbonates, and combinations thereof. Specific non-limiting examples of such chemical foaming agents include, but are not limited to, azodicarbonamide (ADCA), N,N-dinitroso pentamethylene tetramine (DPT), 4,4'-oxybis benzenesulfonyl hydrazide (OBSH), hydrazo dicarbonamide (HDCA), and sodium hydrogen carbonate ($NaHCO_3$). If included, the chemical foaming agent is typically included in the thermoplastic encapsulant 18 in an amount of from 0.1 to 25, alternatively from 0.1 to 10, alternatively from 1 to 25, alternatively from 1 to 20, alternatively from 1 to 10, alternatively from 1 to 5, alternatively from 1 to 7, alternatively from 5 to 15, alternatively from 5 to 10, parts by weight based on 100 parts by weight of the thermoplastic encapsulant 18.

The thermoplastic encapsulant 18 may optionally include one or more additives. Suitable additives for purposes of the instant disclosure include, but are not limited to, catalysts, chain-extenders, crosslinkers, curatives, chain-terminators, compatibilzers, elastomers, thermoplastic elastomers, impact modifiers, processing additives, lubricants, adhesion promoters, anti-oxidants, defoamers, anti-foaming agents, water scavengers, molecular sieves, plasticizers, ultraviolet light stabilizers, flame retardants, thixotropic agents, silicones, colorants, inert diluents, and combinations thereof. If included, the additive can be included in the thermoplastic encapsulant 18 in various amounts.

The components of thermoplastic encapsulant 18, e.g. the thermoplastic resin, the filler, etc., are typically compounded on a single-screw extruder, a twin-screw extruder, a Banbury mixer, a kneader, a mill/mixing roll, or the like to form the thermoplastic encapsulant 18. After compounding, the thermoplastic encapsulant 18 is typically pelletized, diced, or granulated. In a typical embodiment, the components of the thermoplastic are compounded on a twin-screw extruder and pelletized upon discharge. Of course, the thermoplastic encapsulant 18 of the subject disclosure is not limited to thermoplastic encapsulants formed via the methods described above.

The thermoplastic encapsulant 18 of the subject disclosure typically has: a density of from 0.9 to about 3.0, alternatively 1.0 to 2.5, alternatively 1.1 to 2.5, alternatively 1.4 to 2.5, alternatively from 1.6 to 2.2, alternatively from 1.8 to 2.0, g/cm$^3$ when tested in accordance with ISO 1183; a coefficient of linear thermal expansion of less than 80, alternatively from 10 to 60, $10^{-6}$/° C. when tested in accordance with ISO 307; a viscosity (VN) of from 50 to 65 ml/g at 260° C. when tested in accordance with ISO 307; a melting point of greater than 200, alternatively greater than 230, alternatively greater than 260, ° C.; a heat deflection temperature of greater than 150, alternatively from 160 to 200, ° C. when tested in accordance with ISO 75, Method A; a tensile modulus of greater than 10,000 MPa, a tensile stress at break of greater than 25 MPa, and a tensile strain at break of less than 5%, when tested in accordance with ISO 527 at 23° C.; and a flexural strength of greater than 150 MPa and a flexural modulus of greater than 10,000 MPa, when tested in accordance with ISO 178 at 23° C.; a Charpy notched impact of greater than 0.5 KJ/m$^2$ at 23° C. and greater than 1 KJ/m$^2$ at −30° C., alternatively greater than 1 KJ/m$^2$ at 23° C. and greater than 1.3 KJ/m$^2$ at −30° C., alternatively greater than 1.5 KJ/m$^2$ at 23° C. and greater than 1.4 KJ/m$^2$ at −30° C., alternatively greater than 1.6 KJ/m$^2$ at 23° C. and greater than 0.5 KJ/m$^2$ at −30° C., when tested in accordance with ISO 179; a Charpy un-notched impact of greater than 3 KJ/m2 at 23° C. and greater than 3 KJ/m$^2$ at −30° C., alternatively greater than 4 KJ/m$^2$ at 23° C. and greater than 4 KJ/m$^2$ at −30° C., alternatively greater than 5 KJ/m$^2$ at 23° C. and greater than 5 KJ/m$^2$ at −30° C., alternatively greater than 6.5 KJ/m$^2$ at 23° C. and greater than 5.2 KJ/m$^2$ at −30° C., when tested in accordance with ISO 179.

The encapsulated electronic assembly 10, whether it is stand-alone (e.g. a flash drive) or a part of a whole (e.g. an automotive part), is typically exposed to a wide range of temperatures. The thermoplastic encapsulant 18 of the subject disclosure exhibits consistent physical properties over a broad range of temperatures. For example, the thermoplastic encapsulant 18 typically has a Charpy notched impact at −30° C. which is at least 80% the Charpy un-notched impact at 23° C. and a Charpy un-notched impact at −30° C. which is at least 70% of the Charpy un-notched impact at 23° C., alternatively a Charpy notched impact at −30° C. which is at least 85% the Charpy un-notched impact at 23° C. and a Charpy un-notched impact at −30° C. which is at least 78% of the Charpy un-notched impact at 23° C., when tested in accordance with ISO 179. As such, the thermoplastic encapsulant 18, more specifically, the foamed thermoplastic shell 14 formed therefrom protects the electronic component 12 over a broad range of temperatures.

The thermoplastic encapsulant 18 is foamed with a foaming agent. The foaming agent may be a chemical or a physical foaming agent. If foamed with a physical foaming agent, the physical foaming agent is typically added after the thermoplastic encapsulant 18 is compounded, typically during the formation of the encapsulated electronic assembly 10, as is discussed in greater detail below. The terminology physical foaming agent refers to foaming agents that do not chemically react to foam the thermoplastic encapsulant 18. The physical foaming agent used can be a gas or liquid. The physical foaming agent is typically a liquid that evaporates into a gas which foams the thermoplastic encapsulant 18. One specific, non-limiting example of a physical foaming agent is liquid nitrogen.

The physical foaming agent may be a hydrocarbon (e.g. pentane, isopentane, and cyclopentane), halogenated hydrocarbon, or an inert gas in the liquid phase (liquid $CO_2$). The physical foaming agent is typically an inert gas in the liquid phase. The physical foaming agent is typically selected from the group of liquid carbon dioxide, liquid nitrogen, and combinations thereof. In one embodiment, the physical foaming agent is liquid nitrogen. In another embodiment, the physical foaming agent is liquid carbon dioxide. If used to foam the thermoplastic encapsulant 18, the physical foaming agent is typically used in an amount of from 0.01 to 5, alternatively from 0.015 to 2.5, alternatively from 0.1 to 0.8, alternatively from 0.1 to 0.5, parts by weight based on 100 parts by weight of the thermoplastic encapsulant 18.

Regardless of whether the thermoplastic encapsulant 18 is foamed with a chemical foaming agent or with a physical foaming agent, the foamed thermoplastic shell 14 typically has a density of from 1.9 to 2.1, alternatively 1.8 to 2.1, alternatively 1.7 to 2.1, alternatively 1.6 to 2.1, alternatively 1.8 to 2.0, alternatively 1.7 to 2.1, alternatively 1.8 to 1.9, alternatively 1.7 to 1.9, alternatively 1.6 to 1.9, g/cm$^3$ when tested in accordance with ISO 1183. The foamed thermoplastic shell 14 typically has a density from 2 to 40, alternatively from 2 to 25, alternatively from 2 to 15, alternatively from 4 to 25, alternatively from 4 to 15, alternatively from 4 to 8, percent less than the density of the thermoplastic encapsulant 18 when tested in accordance with ISO 1183. Typically, a minimal amount of thermoplastic encapsulant 18 is required to encapsulate the electronic component because the thermoplastic encapsulant 18 is foamed.

The instant disclosure also provides a method of encapsulating the electronic component 12 to form the encapsulated electronic assembly 10. The encapsulated electronic assembly 10 includes the foamed thermoplastic shell 14, which is formed from the thermoplastic encapsulant 18 and disposed about the electronic component 12. The electronic component 12 as well as the thermoplastic encapsulant 18 and the foamed thermoplastic shell 14 formed therefrom are just as described above.

The method includes the step of melting the thermoplastic encapsulant 18. To melt the thermoplastic encapsulant 18, compounded pellets of the thermoplastic encapsulant 18 are typically fed through a feeder into an injection molding machine having a barrel and a mold 30 attached thereto. The barrel and screw(s) thereof impart shear to the thermoplastic encapsulant 18. Heating media are housed around the barrel and establish temperature zones in the barrel that are varied according to processing conditions known to those of skill in the art. As the thermoplastic encapsulant 18 is transported through the barrel it melts, typically at a temperature of from 230 to 320, alternatively from 280 to 290, ° C., thereby transforming from a rigid pelletized state to a molten state.

The method also includes the step of foaming the thermoplastic encapsulant 18. As described above, the thermoplastic encapsulant 18 can be foamed with a chemical and/or a physical foaming agent. In a typical embodiment of the method, the thermoplastic encapsulant 18 is foamed with a physical foaming agent such as liquid $CO_2$, liquid $N_2$, etc. Such physical foaming agents are sometimes referred to in the art as supercritical fluids. In this embodiment, the step of foaming the thermoplastic encapsulant 18 may be further defined as injecting the physical foaming agent into the thermoplastic encapsulant 18 during the step of melting the thermoplastic encapsulant 18. Of course, the steps of melting the thermoplastic encapsulant 18 and foaming the thermoplastic encapsulant 18 can be conducted separately. The physical foaming agent is typically injected trough a pressurized injector port which meters the amount of foaming agent injected relative to the amount of the thermoplastic encapsulant 18 which is being transported through the barrel to ensure the desired amount of foaming agent is injected. As described above, the physical foaming agent is typically injected through the pressurized injector port and into the thermoplastic encapsulant 18 in an amount of from 0.015 to 2.5, alternatively from 0.1 to 2.5, alternatively from 0.1 to 0.8, alternatively from 0.1 to 0.5, alternatively from 0.2 to 2.5, alternatively from 0.2 to 0.8, alternatively from 0.2 to 0.5, parts by weight based on 100 parts by weight of the thermoplastic encapsulant 18.

During the step of foaming, the foaming agent forms cells 20 in the thermoplastic encapsulant 18. Typically, as an amount of foaming agent used increases, number the cells 20 increases and the average diameter of the cells 20 tend to decrease. In one embodiment, 0.3 to 0.9, alternatively from 0.2 to 0.8 parts by weight liquid nitrogen based on 100 parts by weight of the thermoplastic encapsulant 18 is used to form cells 20 having a diameter of from 10 to 300, alternatively 10 to 250, alternatively 10 to 200, alternatively 10 to 150, μm.

As size of the cells 20 increases, it typically becomes more difficult to obtain uniform cell structure (cells 20 of consistent size and distribution) throughout the foamed thermoplastic shell 14. As such, the amount of foaming agent used and processing parameters should be adjusted to obtain cells 20 of consistent size and distribution. If an amount of foaming agent is not enough or if the processing parameters are not adjusted, fewer, larger cells 20 may form in low pressure areas of the thermoplastic shell 14 (as opposed to the formation of cells 20 of consistent size and distribution). In such a situation, a decrease in the viscosity of the thermoplastic encapsulant 18 may not occur and the electronic component 12 may be damaged during injection molding and/or the foamed thermoplastic shell 14 may have minimal density reduction and, consequently, the encapsulated electronic assembly 10 may have minimal weight savings.

The decreased material viscosity typically allows for: injection molding speeds of from 0.5 to 7, alternatively from 0.5 to 5, alternatively from 1 to 5, alternatively from 1 to 2, seconds; shorter holding times of from 5 to 10 seconds (relative to typical holding times of from 15 to 20 seconds); and lower pack and holding pressures of from 4 to 6,000 psi (relative to typical pack and holding pressures of from 8 to 10,000 psi). The mold 30 typically has a temperature of from 70 to 120, alternatively from 80 to 100, ° C.

The step of foaming the thermoplastic encapsulant 18, if a physical foaming agent is used, includes the sub-steps of: (1) injecting the physical foaming agent into the thermoplastic encapsulant 18 via the pressurized injector port in the barrel of the injection molding machine to form a single-phase solution comprising a mixture of the thermoplastic encapsulant 18 and the physical foaming agent; (2) subjecting the single-phase solution to a large pressure drop in the injection molding machine to facilitate nucleation and formation of cells 20 of the physical foaming agent within the thermoplastic encapsulant 18; (3) heating and pressurizing the thermoplastic encapsulant 18 such that the physical foaming agent therein diffuses out of the molten thermoplastic encapsulant 18 thereby expanding cells 20 of the physical foaming agent within the thermoplastic encapsulant 18; and (4) injecting the foamed thermoplastic encapsulant 18 into the mold 30 at a pressure drop to form and dispose the foamed thermoplastic shell 14 about the electronic component 12.

In a typical embodiment, the method of encapsulating the electronic component 12 to form the encapsulated electronic assembly 10 uses the foamed thermoplastic shell 14 to encapsulate the electronic component 12. Because the thermoplastic encapsulant 18 is foamed, it can be highly filled yet be injected molded at low injection pressures, which results in lower cavity pressures, to effectively encapsulate the electronic component 12 without damaging various sub-components, such as solder joints, of the electronic component 12. Said differently, the composition of the thermoplastic encapsulant 18 including the physical foaming agent injected therein has a viscosity over a range of processing parameters (e.g. temperatures and pressures) that allows the foamed thermoplastic encapsulant 18 to flow into cavities within the electronic component 12 and encapsulate the electronic component 12 without damaging the electronic component 12. Further, the method allows for the use of polymers and fillers that would otherwise render the thermoplastic encapsulant 18 unmoldable or, if moldable, render the thermoplastic encapsulant 18 that would actually damage the electronic component 12 during injection molding. Once the foamed thermoplastic shell 14 is formed around the electronic component 12, the electronic component 12 is compressed such that the various parts are mechanically locked with one another within the foamed thermoplastic shell 14 and are therefore less likely fail, e.g. to experience solder joint failure.

In a one embodiment of the method, the thermoplastic encapsulant 18 is foamed with a chemical foaming agent such as hydrazo dicarbonamide. In this embodiment, the chemical foaming agent is typically compounded into the thermoplastic encapsulant 18 as described above. As such, the thermoplastic encapsulant 18, typically in pellet form, is fed into the injection mold machine having the chemical foaming agent compounded therein. In this embodiment, the step of foaming the thermoplastic encapsulant 18 may be further defined as heating the thermoplastic encapsulant 18 to a temperature sufficient to decompose the chemical foaming agent included therein.

The method also includes the step of injection molding the foamed thermoplastic encapsulant 18 about the electronic component 12 to form the encapsulated electronic component 10. The encapsulated electronic component 10 is formed in the mold 30.

Referring now to FIGS. 4A, 4B, 5A, and 5B, the encapsulated electronic component 10 is formed in the mold 30 comprising a front half 32 and a rear half 34 which are drawn together to form a mold cavity 40, 56. The front half 32 typically includes a front insert 36 having a front inner surface 38 which defines a front mold cavity 40. The front half 32 also typically includes locating pins 42 and/or a locating block(s) 44 on which the electronic component 12 is secured within the front mold cavity 40. The front half 32 also typically includes a sprue 46 and defines a front runner 48 and front gate 50. The molten thermoplastic encapsulant 18 is introduced into the mold 30 through the sprue 46. The sprue 46 abuts the barrel nozzle (not shown) of the molding machine and regulates/allows the flow of molten thermoplastic encapsulant 18 from the barrel into the front runner 48.

Still referring to FIGS. 4A, 4B, 5A, and 5B, the mold 30 also includes the rear half 34. The rear half 34 of the mold 30 typically includes a rear insert 52 having a rear inner surface 54 which defines a rear cavity 56. The rear half 34 also typically includes rear locating pins 58 on which the electronic component 12 is secured within the rear cavity 56 along with the rear ejection pins 60 which eject the encapsulated electronic assembly 10 from the mold 30. The rear half 34 also defines a rear runner 62 and rear gate 64.

During the step of front molding, the front and rear halves 32, 34 are typically drawn together (closed) to form a mold cavity 40, 56, a runner 48, 62, and a gate 50, 64. More specifically, the mold cavity is typically defined by the inner surfaces of the front and rear halves 32, 34 and includes the front and rear cavities 40, 56 and has a specific geometry depending on the particular electronic component 12 and dimensions of the encapsulated electronic assembly 10. Of course, the front half 32 and the rear half 34 also form a runner 48, 62 as well as a gate 50, 64 when drawn together. When the front and rear halves 32, 34 are drawn together, the molten thermoplastic encapsulant 18 typically flows through the runner 48, 62 and enters the gate 50, 64 and is injected into the mold cavity 40, 56 to encapsulate the electronic component 12 and form the encapsulated electronic assembly 10.

At the onset of the step of injection molding the encapsulated electronic assembly 10, the electronic component 12 is typically placed in the mold 30, which is open. The front and rear halves 32, 34 of the mold are drawn together (closed) to form a mold cavity 40, 56 and the foamed thermoplastic encapsulant 18 is injected into the mold cavity 40, 56 to form the thermoplastic shell 14 around the electronic component 12. The mold 30 is opened and the encapsulated electronic assembly 10 is removed. The molding process may be an automated process and may also include the use of multi-cavity molds, robotics, and other injection molding technologies known to those skilled in the art. As such, the method of encapsulating the electronic component 12 can be conducted in an efficient automated process which requires few steps and minimal amounts of material (e.g. thermoplastic encapsulant 18).

The foamed thermoplastic shell 14, which is disposed about the electronic component 12, is typically from 0.5 to 10, alternatively from 1 to 5, alternatively from 1 to 2.5, mm thick. Further, the foamed thermoplastic shell 14 typically includes the cells 20, which are uniform in size, and a skin on its exterior surfaces, which is relatively dense and durable (substantially free of cells 20). Accordingly, the foamed thermoplastic shell 14 provides resistance to vibration and shock.

The following examples are intended to illustrate the instant disclosure and are not to be viewed in any way as limiting to the scope of the instant disclosure.

EXAMPLES

In accordance with the subject disclosure, the compositions of Thermoplastic Encapsulants 1-19 are set forth in Tables 1-a and 1-b below, with all amounts is in parts by weight based on 100 parts by weight of the thermoplastic encapsulant.

TABLE 1-a

|  | TE 1 | TE 2 | TE 3 | TE 4 | TE 5 | TE 6 | TE 7 | TE 8 | TE 9 | TE 10 |
|---|---|---|---|---|---|---|---|---|---|---|
| Thermoplastic Resin A | 23.9 | 19.9 | 18.9 | 23.9 | 23.9 | 23.9 | 23.9 | 18.9 | 18.9 | 18.9 |
| Filler A | 70.0 | 70.0 | — | — | — | — | — | 50.0 | 37.5 | — |
| Filler B | — | — | 75.0 | — | — | — | — | — | — | 18.8 |
| Filler C | — | — | — | 70.0 | — | — | — | — | — | — |
| Filler D | — | — | — | — | 70.0 | — | — | — | — | — |
| Filler E | — | — | — | — | — | 70.0 | — | — | — | — |
| Filler F | — | — | — | — | — | — | 70.0 | — | — | — |
| Filler G | — | — | — | — | — | — | — | 25.0 | 37.5 | 56.3 |
| Impact Modifier | 4.0 | 8.0 | 4.0 | 4.0 | 4.0 | 4.0 | 4.0 | 4.0 | 4.0 | 4.0 |
| Plasticizer | 1.5 | 1.5 | 1.5 | 1.5 | 1.5 | 1.5 | 1.5 | 1.5 | 1.5 | 1.5 |
| Lubricant A | 0.4 | 0.4 | 0.4 | 0.4 | 0.4 | 0.4 | 0.4 | 0.4 | 0.4 | 0.4 |
| Heat Stabilizer | 0.3 | 0.3 | 0.3 | 0.3 | 0.3 | 0.3 | 0.3 | 0.3 | 0.3 | 0.3 |
|  | 100.0 | 100.0 | 100.0 | 100.0 | 100.0 | 100.0 | 100.0 | 100.0 | 100.0 | 100.0 |

TABLE 1-b

|  | TE 11 | TE 12 | TE 13 | TE 14 | TE 15 | TE 16 | TE 17 | TE 18 | TE 19 |
|---|---|---|---|---|---|---|---|---|---|
| Thermoplastic Resin A | 18.9 | 18.9 | 18.9 | — | — | 23.4 | — | 18.9 | 13.9 |
| Thermoplastic Resin B | — | — | — | 23.9 | 18.9 | — | 23.3 | — | — |
| Filler A | 37.5 | 37.5 | 37.5 | 70.0 | 37.5 | 70.0 | 70.0 | 75.0 | — |
| Filler B | 37.5 | — | — | — | — | — | — | — | 80.0 |
| Filler C | — | 37.5 | — | — | — | — | — | — | — |

TABLE 1-b-continued

| | TE 11 | TE 12 | TE 13 | TE 14 | TE 15 | TE 16 | TE 17 | TE 18 | TE 19 |
|---|---|---|---|---|---|---|---|---|---|
| Filler E | — | — | 37.5 | — | — | — | — | — | — |
| Filler G | — | — | — | — | 37.5 | — | — | — | — |
| Impact Modifier | 4.0 | 4.0 | 4.0 | 4.0 | 4.0 | 4.0 | 4.0 | 4.0 | 4.0 |
| Plasticizer | 1.5 | 1.5 | 1.5 | 1.5 | 1.5 | 1.5 | 1.5 | 1.5 | 1.5 |
| Lubricant A | 0.4 | 0.4 | 0.4 | 0.4 | 0.4 | 0.4 | — | 0.4 | 0.4 |
| Lubricant B | — | — | — | — | — | — | 1.0 | — | — |
| Heat Stabilizer | 0.3 | 0.3 | 0.3 | 0.3 | 0.3 | 0.3 | 0.3 | 0.3 | 0.3 |
| Colorant | — | — | — | — | — | 0.5 | — | — | — |
| | 100.0 | 100.0 | 100.0 | 100.0 | 100.0 | 100.0 | 100.0 | 100.0 | 100.0 |

Thermoplastic Resin A is low viscosity polyamide 6.
Thermoplastic Resin B is moderate viscosity polyamide 6.
Filler A is talc.
Filler B is fumed silica.
Filler C is calcium carbonate.
Filler D is magnesium oxide.
Filler E is barium sulfate.
Filler F is kaolin clay.
Filler G is glass spheres.
Impact Modifier is maleic anhydride functionalized polyethylene.
Plasticizer is triethylene glycol.
Lubricant A is N,N' ethylene bis-stearamide wax.
Lubricant B is zinc stearate.
Heat Stabilizer is a hindered amine.
Colorant is nigrosine.

Thermoplastic Encapsulants 1-19 are compounded on a twin-screw extruder (Berstorff ZE 40). The twin-screw extruder includes two screws that rotate at a certain speed (RPM) in a barrel to transfer the mixture of components through the barrel. The barrel provides a bearing surface where shear is imparted from the two screws to compound the components and form each thermoplastic encapsulant. Heating media are housed around the barrel and establish temperature zones in the barrel that are varied according to processing conditions known to those of skill in the art. Once compounded into a molten form, the thermoplastic encapsulant is pushed through a strand die head and into a water bath and pelletized. The pellets are then stored for later use.

After compounding, Thermoplastic Encapsulant 1 is injection molded about the electronic component on an Arburg 88-ton Injection Molding Machine (commercially available from Arburg) which is outfitted with a MuCell Modular Upgrade (commercially available from Trexel Incorporated) to form the foamed thermoplastic shell.

More specifically the pellets of Thermoplastic Encapsulant 1 are fed into the Arburg 88-ton Injection Molding Machine having a general purpose barrel and a mold attached thereto. The injection unit comprises a barrel and screw which provides a bearing surface where shear is imparted to the Thermoplastic Encapsulant 1. Heating media are housed around the barrel to establish temperature zones in the barrel that are varied according to processing conditions known to those of skill in the art. As Thermoplastic Encapsulant 1 is transported through the barrel it melts, transforming from a rigid pelletized state to a molten state.

Once in a molten state, Thermoplastic Encapsulant 1 is foamed with liquid $N_2$. More specifically, the $N_2$ is injected into the molten Thermoplastic Encapsulant 1 through a pressurized injector port in an amount of in an amount of 0.4 parts by weight based on 100 parts by weight of the thermoplastic encapsulant. The injector port is designed to meter the amount of foaming agent injected given the amount of Thermoplastic Encapsulant 1 which is being transported through the barrel to ensure the desired amount of foaming agent is injected and works in conjunction with a screw configuration and processing parameters (temperature and pressure), and is designed to ensure that the liquid $N_2$ forms a single-phase solution with the molten Thermoplastic Encapsulant 1.

Referring now to the mold, the electronic component is typically placed in the mold, which is open. In this particular example, the electronic component is a circuit board. The mold is then closed to form a mold cavity. Thermoplastic Encapsulant 1 having the $N_2$ therein is injected into the mold cavity to form the thermoplastic shell around the circuit board. The mold is opened and an encapsulated electronic assembly is removed comprising the circuit board having the foamed Thermoplastic Encapsulant 1 disposed thereon.

For comparative purposes, Thermoplastic Encapsulant 1 having no $N_2$ therein is injected into the mold cavity to form a thermoplastic shell around a circuit board. The mold is opened and a comparative encapsulated electronic assembly is removed comprising the circuit board having the unfoamed thermoplastic encapsulant disposed thereon.

The processing parameters used to form the encapsulated electronic assembly and the comparative encapsulated electronic assembly are set forth in Table 2 below.

TABLE 2

| | Encapsulated Electronic Assembly | Comparative Electronic Assembly |
|---|---|---|
| Molding Conditions | | |
| Temp Rear Zone (° C) | 540 | 550 |
| Temp Rear Zone (° C) | 550 | 560 |
| Temp Middle Zone (° C.) | 560 | 570 |
| Temp Front Zone, (° C.) | 560 | 570 |
| Temp Nozzle, (° C.) | 560 | 570 |
| Actual Melt (° C.) | 560 | 570 |
| Injection Pressure - actual (psi) | 6,000 | 10,000 |
| Hold pressure (psi) | 0 | 8,000 |
| Hold time (sec) | 5-10 | 15-20 |
| Cure time (sec) | 15-20 | 20-25 |
| Mold Temperature A (° C.) | 85 | 100 |
| Mold Temperature B (° C.) | 85 | 100 |
| Test Results | | |

TABLE 2-continued

|  | Encapsulated Electronic Assembly | Comparative Electronic Assembly |
| --- | --- | --- |
| Shell Density | 1.82 | 1.92 |
| Coverage (% fill based on 100% of the free volume in the mold) | 100 | 80 |
| Solder damage (Y/N) | No | Yes |
| Board Warpage (Y/N) | No | Yes |
| Thermal Cycling Results | Pass | Fail |

Once molded, the encapsulated electronic assembly and the comparative encapsulated electronic assembly are X-rayed to determine the amount of solder damage. The comparative encapsulated electronic assembly exhibits solder damage as determined by a visual examination of the solder joints. In contrast, the encapsulated electronic assembly exhibits no visible solder damage.

Further, the encapsulated electronic assembly and the comparative encapsulated electronic assembly are cut in half and a cross-section of each particular assembly is examined to determine if the circuit board warped during the injection molding process. The circuit board of the comparative encapsulated electronic assembly (non-foamed assembly) is warped while the circuit board of the encapsulated electronic assembly is not.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is also to be understood that any ranges and subranges relied upon in describing various embodiments of the instant disclosure independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the instant disclosure, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The instant disclosure has been described in an illustrative manner, and it is to be understood that the terminology which has been used is intended to be in the nature of words of description rather than of limitation. Obviously, many modifications and variations of the instant disclosure are possible in light of the above teachings. It is, therefore, to be understood that within the scope of the appended claims, the instant disclosure may be practiced otherwise than as specifically described.

What is claimed is:

1. A method of forming an encapsulated electronic assembly, said method comprising the steps of:
   melting a thermoplastic encapsulant composition comprising polyamide and greater than 50 parts by weight of a filler based on 100 parts by weight of the composition;
   foaming the melted composition;
   injection molding the foamed composition against an electronic component; and
   solidifying the injected composition to form a foamed thermoplastic shell encapsulating the electronic component, the shell being substantially free of cells at an outermost skin thereof and at portions thereof contacting the electronic component, with remaining interior portions of the shell comprising evenly dispersed generally uniform cells.

2. A method as set forth in claim 1 wherein the filler comprises talc.

3. A method as set forth in claim 1 wherein the step of foaming is further defined as injecting a physical foaming agent into the composition during the step of melting.

4. A method as set forth in claim 3 wherein the physical foaming agent is selected from the group of liquid carbon dioxide, liquid nitrogen, and combinations thereof and wherein the step of foaming is further defined as injecting into the composition from 0.1 to 0.8 parts by weight of the physical foaming agent based on 100 parts by weight of the composition.

5. A method as set forth in claim 1 wherein the composition comprises from 0.1 to 10 parts by weight of a chemical foaming agent based on 100 parts by weight of the composition and wherein the step of foaming is further defined as heating the composition to a temperature sufficient to decompose the chemical foaming agent included therein.

6. A method as set forth in claim 1 wherein the step of forming decreases density of the composition by from 2 to 40% as tested in accordance with ISO 1183.

7. A method as set forth in claim 1 wherein the generally uniform cells are generally uniform in size and shape.

8. A method as set forth in claim 1 wherein any cells arranged in the shell portions substantially free of cells are smaller and fewer in number than the evenly dispersed cells.

9. A method as set forth in claim 1 wherein the filler comprises one or more materials selected from the group consisting of talc, fumed silica, calcium carbonate, magnesium oxide, barium sulfate, kaolin clay, and glass spheres.

10. A method as set forth in claim 1 wherein the amount of filler is greater than 70 parts by weight based on 100 parts by weight of the composition.

11. A method as set forth in claim 1 wherein the amount of filler is from 65 to 85 parts by weight based on 100 parts by weight of the composition.

12. A method as set forth in claim 1 wherein said thermoplastic encapsulant composition has a coefficient of linear thermal expansion of less than $80 \times 10^{-6}$ mm/mm/° C. when tested in accordance with ISO 11359-1.

13. A method as set forth in claim 1 wherein an electrical connector is connected to said electronic component and extends through the foamed thermoplastic shell to provide electrical interconnection between said electronic component and an external device.

14. A method as set forth in claim 1 wherein said electronic component comprises a printed circuit board.

15. A method as set forth in claim 1 wherein said electronic component is selected from the group of a jump drive, an air bag module, a key fob, a seat module, an antenna module, an antenna, an electric power steering control, a suspension control, a Yaw rate sensor, a low tire pressure sensor, a crash sensor, a blind spot detection sensor, a wheel speed sensor, a door module, an ignition module, a transmission control module, a temperature sensor, a crank position sensor, a mass air flow sensor, an oxygen sensor, a cam sensor, and a power inverter subcomponent.

* * * * *